US011600471B2

(12) United States Patent
Sasaki et al.

(10) Patent No.: US 11,600,471 B2
(45) Date of Patent: Mar. 7, 2023

(54) SUBSTRATE SUPPORT, PLASMA PROCESSING APPARATUS, AND FOCUS RING

(71) Applicant: TOKYO ELECTRON LIMITED, Tokyo (JP)

(72) Inventors: Yasuharu Sasaki, Miyagi (JP); Yohei Uchida, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 59 days.

(21) Appl. No.: 16/677,847

(22) Filed: Nov. 8, 2019

(65) Prior Publication Data

US 2020/0152428 A1  May 14, 2020

(30) Foreign Application Priority Data

Nov. 8, 2018 (JP) .............................. JP2018-210733

(51) Int. Cl.
*H01J 37/32* (2006.01)

(52) U.S. Cl.
CPC .. *H01J 37/32715* (2013.01); *H01J 37/32091* (2013.01); *H01J 37/32642* (2013.01); *H01J 37/32449* (2013.01)

(58) Field of Classification Search
CPC ............. C23C 16/4585; C23C 16/4586; H01J 37/32091; H01J 37/32449; H01J 37/32541; H01J 37/32577; H01J 37/32642; H01J 37/32715; H01L 21/6831; H01L 21/6833
See application file for complete search history.

(56) References Cited

U.S. PATENT DOCUMENTS

| 6,475,336 B1 * | 11/2002 | Hubacek | ............. C23C 16/4585 |
| | | | 156/345.51 |
| 8,449,679 B2 * | 5/2013 | Dhindsa | ............ H01J 37/32642 |
| | | | 118/728 |
| 2010/0000970 A1 * | 1/2010 | Koshimizu | ....... H01J 37/32623 |
| | | | 216/67 |

(Continued)

FOREIGN PATENT DOCUMENTS

| JP | 2007-258417 A | 10/2007 |
| JP | 2011-009351 A | 1/2011 |

(Continued)

*Primary Examiner* — Benjamin Kendall
(74) *Attorney, Agent, or Firm* — Weihrouch IP

(57) ABSTRACT

A substrate support for a plasma processing apparatus includes a first support area configured to support a substrate placed thereon; a second support area configured to support a focus ring placed thereon, and extending in a circumferential direction outward in a radial direction with respect to the first support area; a conductive structure configured to be connected to the focus ring; and a holder configured to hold the connection member to press the connection member downward, and also to cause the connection member to press the surface of the focus ring. The conductive structure includes a first conductive path which provides a terminal area outward in the radial direction with respect to the second support area, and a connection member configured to electrically connect the focus ring and the terminal area, and disposed on the terminal area to face a surface of the focus ring.

16 Claims, 7 Drawing Sheets

(56) References Cited

U.S. PATENT DOCUMENTS

2011/0043228 A1* 2/2011 Makhratchev .... H01J 37/32935
　　　　　　　　　　　　　　　　　　　　　　324/691
2019/0198297 A1* 6/2019 Aramaki ........... H01L 21/67069

FOREIGN PATENT DOCUMENTS

| JP | 2011-120958 A | 10/2011 |
| JP | 2017-055100 A | 3/2017 |

* cited by examiner

SUBSTRATE SUPPORT, PLASMA PROCESSING APPARATUS, AND FOCUS RING

CROSS-REFERENCE TO RELATED APPLICATIONS

This application is based on and claims priority from Japanese Patent Application No. 2018-210733 filed on Nov. 8, 2018 with the Japan Patent Office, the disclosure of which is incorporated herein in its entirety by reference.

TECHNICAL FIELD

An exemplary embodiment of the present disclosure relates to a substrate support, a plasma processing apparatus, and a focus ring.

BACKGROUND

A plasma processing apparatus is used in manufacturing an electronic device. In a plasma processing apparatus disclosed in Japanese Patent Laid-Open Publication No. 2007-258417, a focus ring is disposed to surround a substrate placed on an electrostatic chuck. A DC voltage is applied to the focus ring in order to adjust an upper end position of a sheath above the focus ring.

SUMMARY

In an exemplary embodiment, a substrate support for a plasma processing apparatus is provided. The substrate support includes a first support area, a second support area, a conductive structure, and a holder. The first support area is configured to support a substrate placed thereon. The second support area is configured to support a focus ring placed thereon. The second support area extends in a circumferential direction outward in a radial direction with respect to the first support area. The conductive structure is configured to be connected to the focus ring. The conductive structure includes a conductive path and a connection member. The conductive path provides a terminal area outward in the radial direction with respect to the second support area, and extends downward from the terminal area. The connection member electrically connects the focus ring and the terminal area. The connection member is disposed on the terminal area to face s surface of the focus ring which extends downward, and outward in the radial direction with respect to the connection member. The holder holds the connection member to press the connection member downward, and also to cause the connection member to press the surface of the focus ring.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
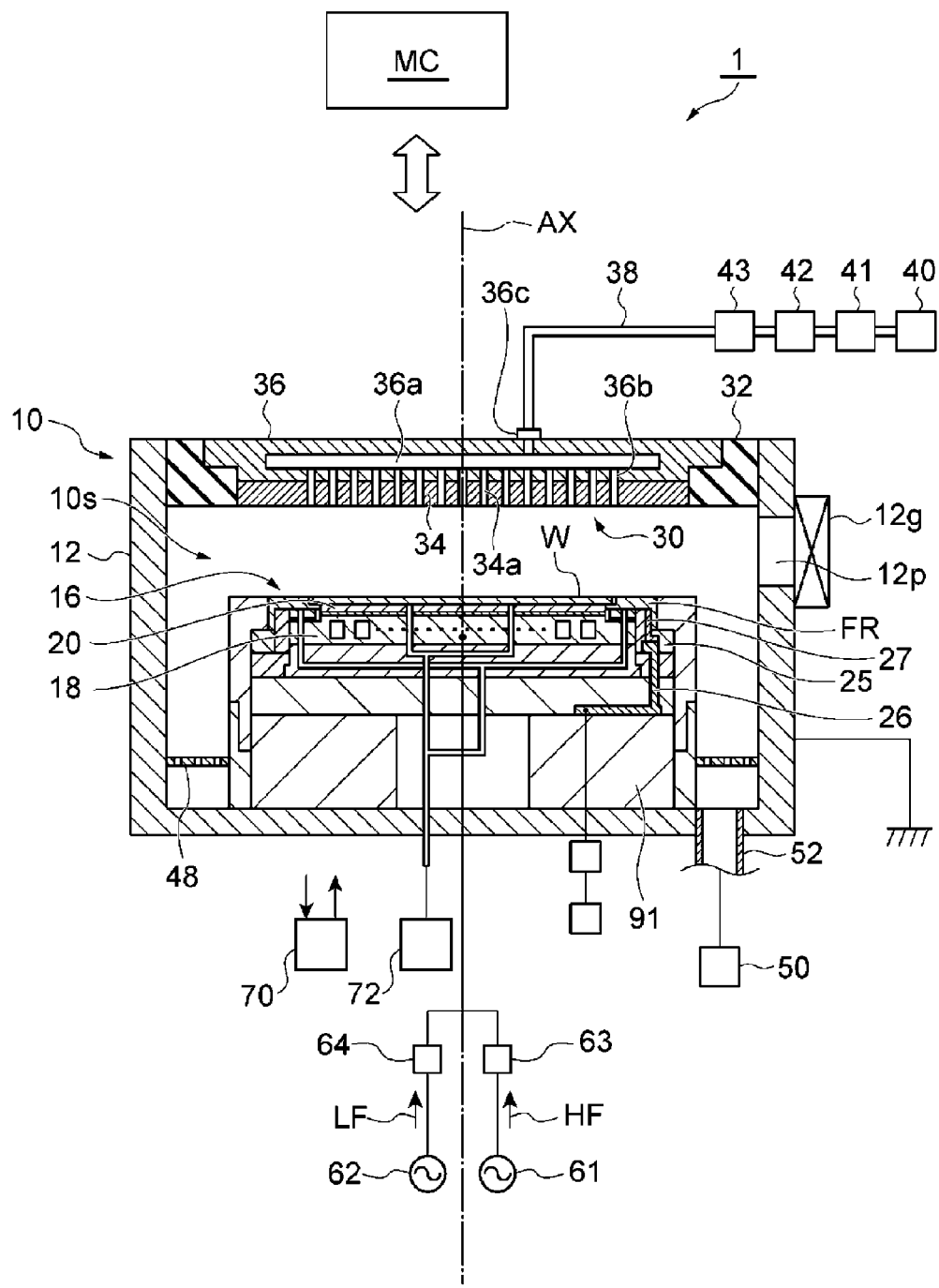
FIG. 1 is a schematic view illustrating a plasma processing apparatus according to an exemplary embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various exemplary embodiments will be described.

In an exemplary embodiment, a substrate support for a plasma processing apparatus is provided. The substrate support includes a first support area, a second support area, a conductive structure, and a holder. The first support area is configured to support a substrate placed thereon. The second support area is configured to support a focus ring placed thereon. The second support area extends in a circumferential direction outward in a radial direction with respect to the first support area. The conductive structure is configured to be connected to the focus ring. The conductive structure includes a conductive path and a connection member. The conductive path provides a terminal area outward in the radial direction with respect to the second support area, and extends downward from the terminal area. The connection member electrically connects the focus ring and the terminal area. The connection member is disposed on the terminal area to face s surface of the focus ring which extends downward, and outward in the radial direction with respect to the connection member. The holder holds the connection member to press the connection member downward, and also to cause the connection member to press the surface of the focus ring.

In the substrate support according to the exemplary embodiment, since the connection member is pressed downward by the holder, a reliable electrical connection is implemented between the connection member and the terminal area. Further, the connection member presses the surface of the focus ring disposed outside the connection member in the radial direction in a state of being held by the holder. Therefore, a reliable electrical connection between the connection member and the focus ring is implemented. Further, the direction in which the connection member presses the surface of the focus ring is a direction substantially orthogonal to the direction in which the electrostatic attractive force generated between the chuck area and the focus ring is exerted. Therefore, an electrical path is provided which is capable of being connected with the focus ring while suppressing generating of the force that opposes the electrostatic attractive force holding the focus ring. According to the substrate support, the focus ring is stably held in the second support area.

In one exemplary embodiment, the connection member may have a first portion and a second portion. The first portion faces the surface of the focus ring. The second portion is continued at a lower portion of the first portion, and extends outward in the radial direction from the first portion. The holder holds the connection member to press the second portion downward. According to the embodiment, the first portion exerts a force outward in the radial direction by pressing the second portion downward.

In one exemplary embodiment, the substrate support may further include a conductive member. The conductive member has elasticity, and is sandwiched between the connection member and the terminal area.

In one exemplary embodiment, the substrate support may further include another conductive member. The conductive member has elasticity, and is sandwiched between the connection member and the surface of the focus ring.

In one exemplary embodiment, the substrate support may further include a focus ring.

In one exemplary embodiment, the focus ring may have a first annular portion and a second annular portion. The first annular portion has an annular shape and also forms a plate shape, and is disposed on the second support area. The second annular portion includes the surface of the focus ring, and extends downward from the first annular portion to face the connection member.

In one exemplary embodiment, the holder may have an insulating property. The connection member may be shielded by the focus ring and the holder. According to the embodiment, the connection member is protected from plasma.

In one exemplary embodiment, the second support area may include a chuck area. The chuck area is configured to hold the focus ring by an electrostatic attractive force. According to the embodiment, the focus ring is firmly held in the chuck area of the second support area.

In one exemplary embodiment, a gas line configured to supply a heat transfer gas between the chuck area and the focus ring may pass through the second support area. According to the embodiment, heat exchange between the second support area and the focus ring which are in contact with each other is promoted.

In another exemplary embodiment, a plasma processing apparatus is provided. The plasma processing apparatus includes a chamber, a substrate support, a radio-frequency power supply, and another power supply. The substrate support is configured to support a substrate and a focus ring in the chamber. The radio-frequency power supply is electrically connected to a lower electrode of the substrate support. The another power supply is electrically connected to a conductive structure outside the chamber. The another power supply is configured to apply a negative voltage to the focus ring.

In yet another exemplary embodiment, a substrate support for a plasma processing apparatus is provided. The substrate support includes a first support area, a second support area, and a conductive structure. The first support area is configured to support a substrate placed thereon. The second support area is configured to support a focus ring placed thereon. The second support area extends in a circumferential direction outward in a radial direction with respect to the first support area. The conductive structure is configured to be connected to the focus ring. The conductive structure includes a conductive path and a connection member. The conductive path provides a terminal area. The connection member electrically connects the focus ring and the terminal area. The connection member is disposed on the terminal area to face s surface of the focus ring which extends downward, and outward in the radial direction with respect to the connection member. The connection member presses the terminal area, and also presses the focus ring.

In yet another exemplary embodiment, a focus ring is provided. The focus ring includes a first annular portion and a second annular portion. The second annular portion extends downward from an outer periphery of the first annular portion.

Hereinafter, various exemplary embodiments will be described in detail with reference to the drawings. Meanwhile, in the respective drawings, the same or corresponding parts will be denoted by the same symbols.

FIG. 1 is a schematic view illustrating a plasma processing apparatus according to an exemplary embodiment. The plasma processing apparatus 1 illustrated in FIG. 1 is a capacitively coupled plasma processing apparatus. The plasma processing apparatus 1 includes a chamber 10. The chamber 10 provides an internal space 10s therein. In the embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A film having a plasma-resistant property is formed on an inner wall surface of the chamber body 12, that is, on a wall surface defining the internal space 10s. The film may be a ceramic film such as a film formed by anodization or a film formed of yttrium oxide.

A passage 12p is formed at a side wall of the chamber body 12. A substrate W passes through the passage 12p when being transferred between the internal space 10s and the outside of the chamber 10. A gate valve 12g is provided along the side wall of the chamber body 12 to open/close the passage 12p.

A substrate support 16 is provided in the chamber 10. The substrate support 16 is configured to support the substrate W placed thereon. The substrate W has a substantially disc shape. The substrate support 16 includes a lower electrode 18 and a chuck area 20 for a substrate. The lower electrode 18 is made of a conductive material such as aluminum, and has a substantially disc shape. The chuck area 20 is provided on the lower electrode 18. The chuck area 20 is configured to hold the substrate W by an electrostatic attractive force generated between the substrate W placed thereon and the chuck area 20. Details of the substrate support 16 will be described later.

The plasma processing apparatus 1 may further include an upper electrode 30. The upper electrode 30 is provided above the substrate support 16. The upper electrode 30 closes an upper opening of the chamber body 12 together with an insulating member 32. The upper electrode 30 is supported in the upper portion of the chamber body 12 through the insulating member 32.

The upper electrode 30 includes an upper plate 34 and a support 36. A lower surface of the upper plate 34 defines the internal space 10s. A plurality of gas discharge holes 34a are formed in the upper plate 34. Each of the plurality of gas discharge holes 34a penetrates the upper plate 34 in a plate thickness direction (vertical direction). The upper plate 34 is made of, for example, silicon, but the upper plate 34 is not limited thereto. Alternatively, the upper plate 34 may have a structure in which a plasma-resistant film is formed on a surface of an aluminum member. The film may be a ceramic film such as a film formed by anodization or a film formed by yttrium oxide.

The support 36 detachably supports the upper plate 34. The support 36 is made of, for example, an insulating material such as aluminum. A gas diffusion chamber 36a is provided inside the support 36. From the gas diffusion chamber 36a, a plurality of gas holes 36b extend downward. The plurality of gas holes 36b communicate with the plurality of gas discharge holes 34a, respectively. A gas introducing port 36c is formed in the support 36. The gas introducing port 36c is connected to the gas diffusion chamber 36a. A gas supply pipe 38 is connected to the gas introducing port 36c.

A gas source group 40 is connected to the gas supply pipe 38 through a valve group 41, a flow rate controller group 42, and a valve group 43. The gas source group 40, the valve group 41, the flow rate controller group 42, and the valve group 43 constitute a gas supply unit. The gas source group 40 includes a plurality of gas sources. Each of the valve group 41 and the valve group 43 includes a plurality of valves (e.g., opening/closing valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 through the valves corresponding to the valve group 41, the flow rate controllers corresponding to the flow rate controller group 42, and the valves corresponding to the valve group 43. The plasma processing apparatus 1 may supply the gases from one or more gas sources selected among the plurality of gas sources of the gas source group 40 to the internal space 10s at individually adjusted flow rates.

A baffle plate 48 is provided between a cylindrical portion 97 (described later) of the substrate support 16 and the side wall of the chamber body 12. The baffle plate 48 may be formed, for example, by coating an aluminum member with ceramic such as yttrium oxide. A plurality of through-holes are formed in the baffle plate 48. Below the baffle plate 48, an exhaust pipe 52 is connected to the bottom of the chamber body 12. The exhaust pipe 52 is connected with an exhaust device 50. The exhaust device 50 includes a pressure controller such as an automatic pressure control valve, and a vacuum pump such as, for example, a turbo molecular pump, and is able to depressurize the internal space 10s.

The plasma processing apparatus 1 further includes one or more radio-frequency power supply. In the embodiment, the plasma processing apparatus 1 may further include a radio-frequency power supply 61. The radio-frequency power supply 61 is a power supply generating a radio-frequency power HF for plasma generation. The radio-frequency power HF has a frequency within a range of 27 MHz to 100 MHz, for example, a frequency of 40 MHz or 60 MHz. The radio-frequency power supply 61 is connected to the lower electrode 18 through a matcher 63 to supply the radio-frequency power HF to the lower electrode 18. The matcher 63 includes a matching circuit to match an output impedance of the radio-frequency power supply 61 and impedance of a load side (the lower electrode 18 side). The radio-frequency power supply 61 may not be electrically connected to the lower electrode 18, and may be connected to the upper electrode 30 through the matcher 63.

In the embodiment, the plasma processing apparatus 1 may further include a radio-frequency power supply 62. The radio-frequency power supply 62 is a power supply generating a bias radio-frequency power for drawing ions into the substrate W, that is, a radio-frequency power LF. A frequency of the radio-frequency power LF is lower than the frequency of the radio-frequency power HF. The frequency of the radio-frequency power LF is a frequency within a range of 400 kHz to 13.56 MHz, for example, 400 kHz. The radio-frequency power supply 62 is connected to the lower electrode 18 through a matcher 64 to supply the radio-frequency power LF to the lower electrode 18. The matcher 64 includes a matching circuit to match an output impedance of the radio-frequency power supply 62 and the impedance of the load side (the lower electrode 18 side).

In the plasma processing apparatus 1, a gas is supplied to the internal space 10s. Then, the gas is excited in the internal space 10s by being supplied with the radio-frequency power HF and/or the radio-frequency power LF. As a result, plasma is generated in the internal space 10s. The substrate W is processed by chemical species such as ions and/or radicals from the generated plasma.

The plasma processing apparatus 1 further includes a control unit MC. The control unit MC is a computer including, for example, a processor, a storage device, an input device, and a display device, and controls respective parts of the plasma processing apparatus 1. Specifically, the control unit MC executes a control program stored in the storage device to control respective parts of the plasma processing apparatus 1 based on a recipe data stored in the storage device. A process designated by the recipe data is executed in the plasma processing apparatus 1, by the control of the control unit MC.

Figure 2:
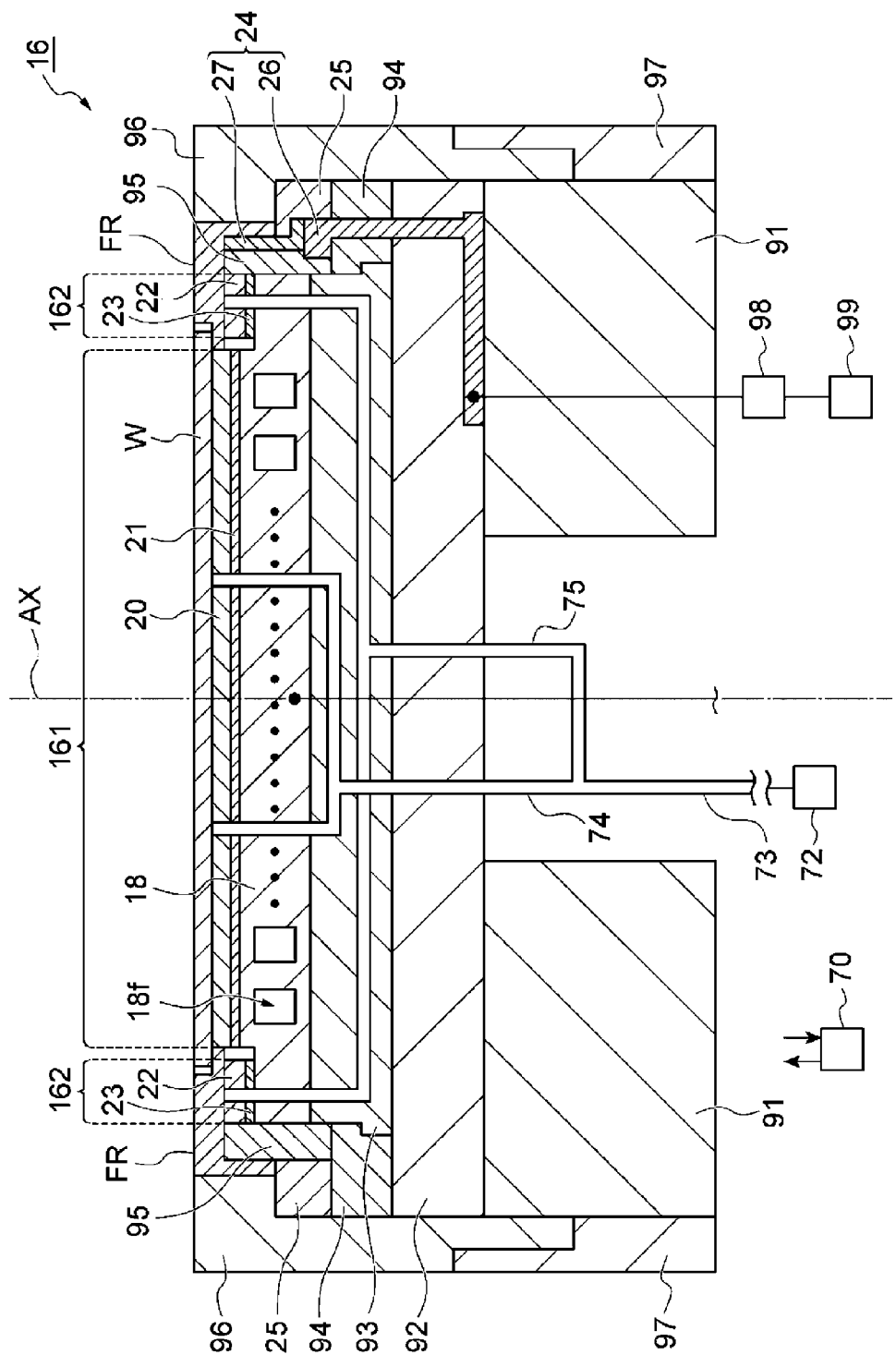
FIG. 2 is a cross-sectional view of a substrate support according to the exemplary embodiment.
Figure 3:
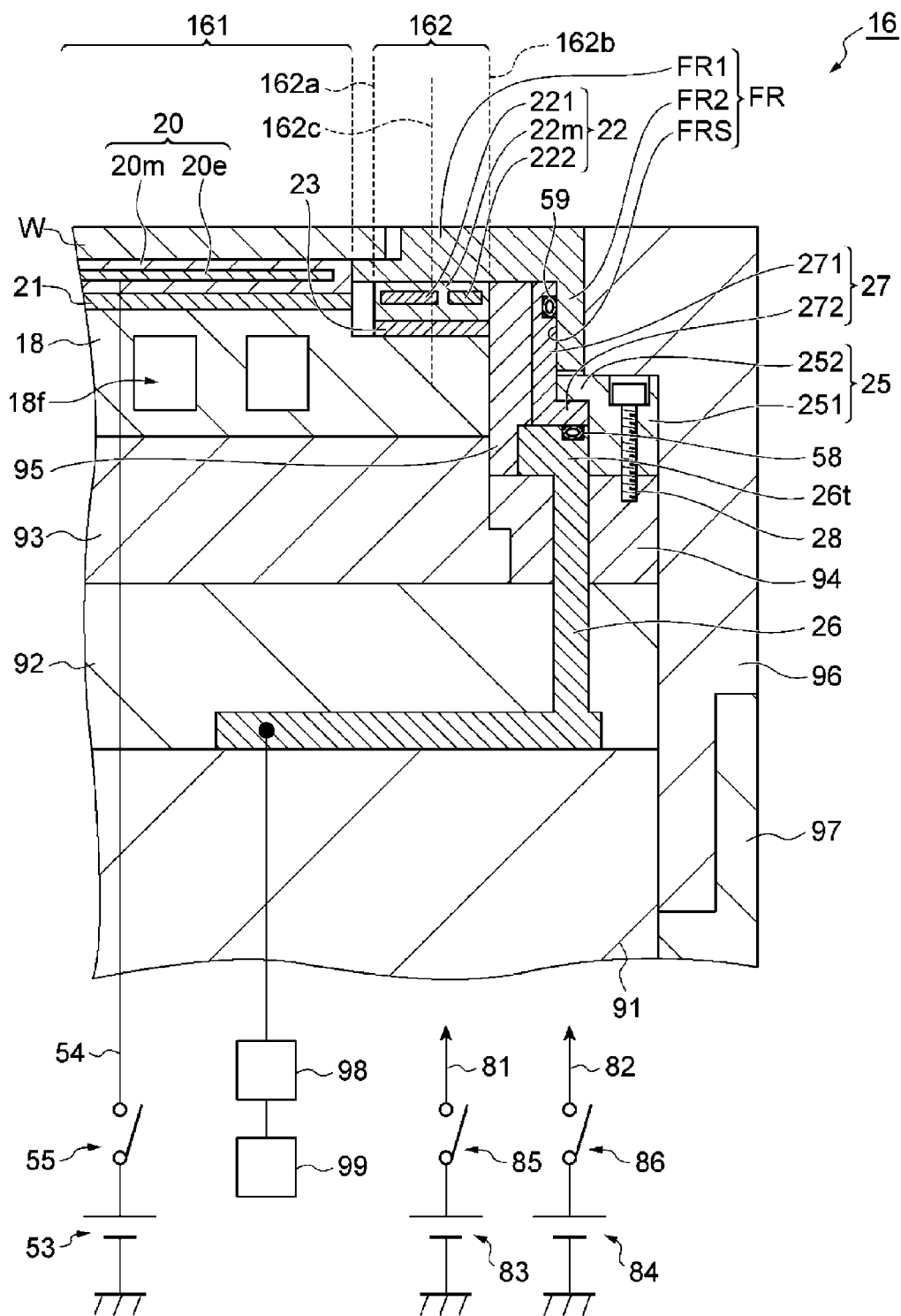
FIG. 3 is a partially enlarged cross-sectional view of the substrate support according to the exemplary embodiment.

In the following, the substrate support 16 will be described in detail with reference to FIGS. 2 and 3 together with FIG. 1. FIG. 2 is a cross-sectional view of a substrate support according to the exemplary embodiment. FIG. 3 is a partially enlarged cross-sectional view of the substrate support according to the exemplary embodiment. As described above, the substrate support 16 includes the lower electrode 18 and the chuck area 20.

A flow path 18f is provided in the lower electrode 18. The flow path 18f is a flow path for a heat exchange medium. Examples of the heat exchange medium include a liquid phase coolant, or a coolant that cools the lower electrode 18 by vaporization thereof (e.g., chlorofluorocarbon). A heat exchange medium supply device 70 (e.g., chiller unit) is connected to the flow path 18f. The heat exchange medium is supplied from the supply device 70 through a pipe to the flow path 18f. The heat exchange medium supplied to the flow path 18f returns to the supply device 70 through another pipe.

The substrate support 16 includes a first support area 161 and a second support area 162. The first support area 161 is configured to support the substrate W placed thereon. The first support area 161 is constituted by the lower electrode 18 and the chuck area 20. That is, the first support area 161 includes a part of the lower electrode 18 and the chuck area 20. An axis AX, which is a central axis of the first support area 161, is an axis extending in the vertical direction. The first support area 161 forms a substantially circular shape in a plan view.

The chuck area 20 is provided on the lower electrode 18. The chuck area 20 has a substantially disc shape. The chuck area 20 is bonded to the upper surface of the lower electrode 18 through a bonding area 21. The bonding area 21 is made of, for example, an adhesive agent.

The chuck area 20 has a body 20m and an electrode 20e. The body 20m has a substantially disc shape. The body 20m is made of a dielectric such as aluminum nitride. The electrode 20e is a film type electrode. The electrode 20e is provided in the body 20m. The electrode 20e is electrically connected to a DC power supply 53 through a conducting wire 54. The electrode 20e may be electrically connected to the DC power supply 53 through the conducting wire 54 and a switch 55.

The substrate W is placed on the upper surface of the chuck area 20. When a voltage from the DC power supply 53 is applied to the electrode 20e, an electrostatic attractive force is generated between the substrate W and the chuck area 20. The chuck area 20 holds the substrate W by the generated electrostatic attractive force.

In the embodiment, the plasma processing apparatus 1 may further include a heat transfer gas supply system. The heat transfer gas supply system is configured to supply, for example, He gas between the substrate W and the chuck area 20. In the embodiment, the heat transfer supply system has a heat transfer gas source 72. A gas line 73 is connected to the source 73. A gas line 74 is branched from the gas line 73. The gas line 74 extends so as to supply the heat transfer gas from the source 72 between the substrate W and the chuck area 20.

The second support area 162 is configured to support a focus ring FR placed thereon. The second support area 162 extends outside the first support area 161 in the radial direction with respect to the axis AX. The second support area 162 extends in the circumferential direction around the axis AX. The second support area 162 forms an annular shape in a plan view.

The second support area 162 is constituted by the lower electrode 18, the chuck area 22 for the focus ring, and a bonding area 23. That is, the second support area 162 includes another part of the lower electrode 18, that is, a circumferential edge portion of the lower electrode 18, the chuck area 22, and the bonding area 23. The chuck area 22 is provided on the circumferential edge of the lower electrode 18. The chuck area 22 extends in the circumferential direction to surround the chuck area 20. The bonding area 23 has an insulating property, and is provided between the chuck area 22 and the lower electrode 18. In the example, the chuck area 23 is an adhesive agent that bonds the chuck area 22 to the upper surface of the lower electrode 18.

Figure 4:
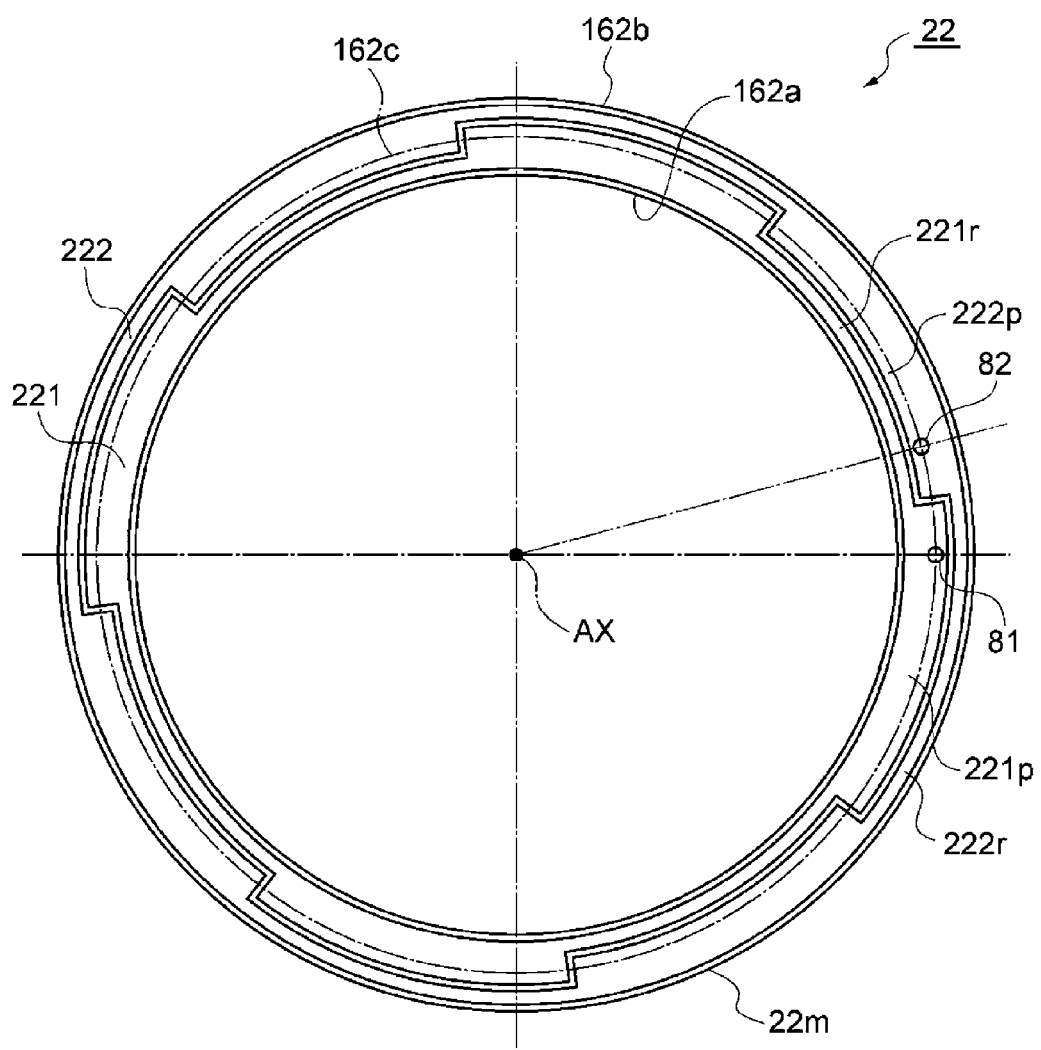
FIG. 4 is a schematic view illustrating layouts of a first electrode and a second electrode in a chuck area for a focus ring of the substrate support according to the exemplary embodiment.
Figure 5A:
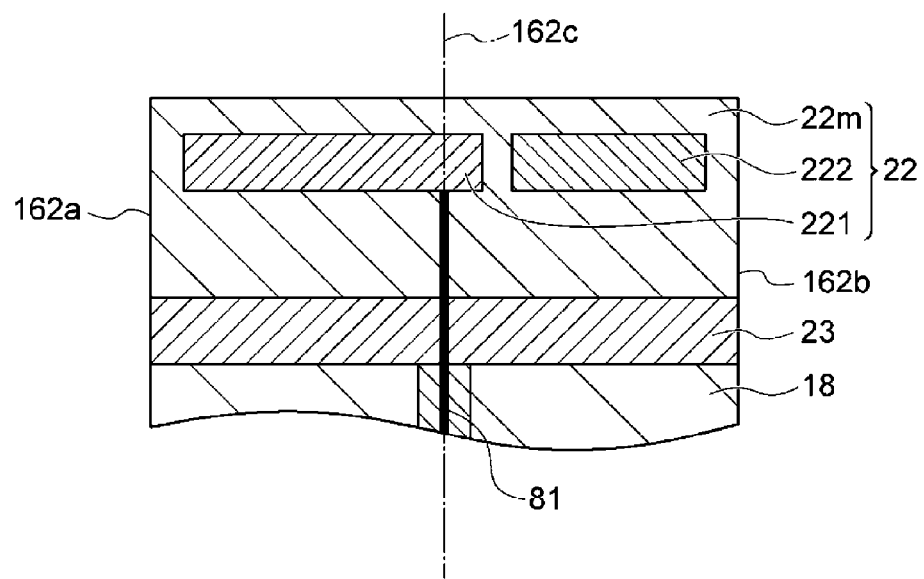
FIGS. 5A and 5B are partially enlarged cross-sectional views of the substrate support according to the exemplary embodiment.
Figure 5B:
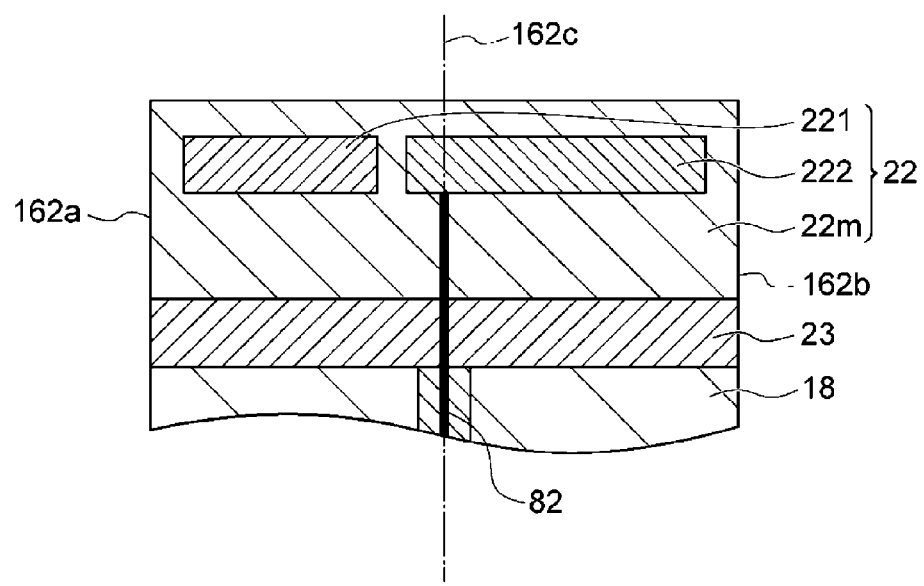

In the following, reference will be made on FIG. 4 and FIGS. 5A and 5B, together with FIGS. 1 to 3. FIG. 4 is a schematic view illustrating layouts of a first electrode and a second electrode in the chuck area for the focus ring of the substrate support according to the exemplary embodiment. Each of FIGS. 5A and 5B is a partially enlarged cross-sectional view of the substrate support according to the exemplary embodiment. FIG. 5A illustrates an enlarged view of a part of the substrate support including the connection location between the first electrode and the first conducting wire. FIG. 5B illustrates an enlarged view of a part of the substrate support including the connection location between the second electrode and the second conducting wire.

The chuck area 22 is configured to hold the focus ring FR placed thereon. The focus ring FR includes a conductive material. The focus ring FT is made of, for example, silicon or silicon carbide. The focus ring FT has an annular shape in a plan view. In the plasma processing apparatus 1, the substrate W is disposed in an area which is on the chuck area 20, and is surrounded by the focus ring FR.

The chuck area 22 has the body 22m, a first electrode 221, and a second electrode 222. The body 22m has an annular shape that forms a plate shape, and is defined by the inner edge and the outer edge thereof. The body 22m is made of a dielectric such as aluminum nitride. The inner edge and the outer edge of the body 22m are the inner edge and the outer edge of the chuck area 22. An inner boundary 162a of the second support area 162 has a cylindrical shape including the inner edge of the chuck area 22. An outer boundary 162b of the second support area 162 has a cylindrical shape including the outer edge of the chuck area 22.

The first electrode 221 and the second electrode 222 are film type electrodes. The first electrode 221 and the second electrode 222 are provided in the body 22m. The first electrode 221 and the second electrode 222 extend in the circumferential direction around the axis AX. The first electrode 221 extends inward the second electrode 222. The first electrode 221 and the second electrode 222 are separated from each other. The first electrode 221 and the second electrode 222 may have the same or substantially the same area. When the first electrode 221 and the second electrode 222 have the same or substantially the same area, the electrostatic attractive force may be maximized.

The substrate support 16 includes a first conducting wire 81 and a second conducting wire 82. The first conducting wire 81 electrically connects the first electrode 221 to a DC power supply 83. The first electrode 221 may be electrically connected to the DC power supply 83 through the first conducting wire 81 and a switch 85. The second conducting wire 82 electrically connects the second electrode 222 to a DC power supply 84. The second electrode 222 may be electrically connected to the DC power supply 84 through the second conducting wire 82 and a switch 86.

The focus ring FR is placed on the upper surface of the chuck area 22. Applying a voltage from the DC power supply 83 to the first electrode 221 and another voltage from the DC power supply 84 to the second electrode 222 generates a potential difference between the first electrode and the second electrode. The potential difference generates an electrostatic attractive force to hold the focus ring FR on the chuck area 22.

In the embodiment, the above described heat transfer gas supply system is further configured to supply the heat transfer gas between the focus ring FR and the chuck area 22. A gas line 75 is further branched from the gas line 73. The gas line 75 extends so as to supply the heat transfer gas from the source 72 between the focus ring FR and the chuck area 22. The gas line 75 extends partially through the second support area 162. In the embodiment, the heat exchange between the second support area 162 (i.e., the chuck area 22) and the focus ring FR is promoted by the heat transfer gas.

As illustrated in FIG. 5A, the first conducting wire 81 is connected to the first electrode 221 through the bonding area 23. As illustrated in FIG. 5B, the second conducting wire 82 is connected to the second electrode 222 through the bonding area 23. The first conducting wire 81 and the second conducting wire 82 extend in the vertical direction in the bonding area 23. Each of the first conducting wire 81 and the second conducting wire 82 may extend through the lower electrode 18 as well. Each of the first conducting wire 81 and the second conducting wire 82 is electrically isolated from the lower electrode 18 in the lower electrode 18. Each of the first conducting wire 81 and the second conducting wire 82 may be surrounded by an insulator in the lower electrode 18.

In the bonding area, the first conducting wire 81 and the second conducting wire 82 extend closer to a center 162c, than the inner boundary 162a and the outer boundary 162b of the second support area 162. The first conducting wire 81 and the second conducting wire 82 may extend on the center 162c. The center 162c is a part which is located at a center between the inner boundary 162a and the outer boundary 162b of the second support area 162. That is, the center 162c is a part which is equidistant in the radial direction from the inner boundary 162a and the outer boundary 162b. Therefore, the center 162c has a cylindrical shape.

In the plasma processing apparatus 1, in the bonding area 23, each of the first conducting wire 81 and the second conducting wire 82 is disposed to have a large distance with respect to each of the inner boundary 162a and the outer boundary 162b of the second support area 162. Therefore, it is possible to secure a large distance between each of the first conducting wire 81 and the second conducting wire 82 and a plasma space. That is, it is possible to secure a large distance between the first conducting wire 81 and the inner edge of the bonding area 23, and between the first conducting wire 81 and the outer edge of the bonding area 23. Further, it is possible to secure a large distance between the second conducting wire 82 and the inner edge of the bonding area 23, and between the second conducting wire 82 and the outer edge of the bonding area 23.

In the embodiment, as described above, each of the first conducting wire 81 and the second conducting wire 82 may extend on the center 162c in the bonding area 23. According to the embodiment, the distance between each of the first conducting wire 81 and the second conducting wire 82 and a plasma space becomes the maximum.

In the embodiment, the first electrode 221 may have a first protrusion 221p. As illustrated in FIG. 4, the first protrusion 221p extends outward with respect to the center 162c, so as to expand the first electrode 221 outward with respect to the center 162c. In the embodiment, the second electrode 222 has a second recess 222r extending along the first protrusion 221p. The first conducting wire 81 is connected to the first protrusion 221p. The first conducting wire 81 extends downward from the first protrusion 221p. That is, the first protrusion 221p is a contacting location between the first electrode 221 and the first conducting wire 81.

In the embodiment, the second electrode 222 may have a second protrusion 222p. As illustrated in FIG. 4, the second protrusion 222p extends inward with respect to the center 162c, so as to expand the second electrode 222 inward with respect to the center 162c. The first electrode 221 has a first recess 221r extending along the second protrusion 222p. The second conducting wire 82 is connected to the second protrusion 222p. The second conducting wire 82 extends downward from the second protrusion 222p. That is, the second protrusion 222p is a contacting location between the second electrode 222 and the second conducting wire 82.

As illustrated in FIG. 4, the first electrode 221 may be formed to alternately provide a plurality of protrusions including the first protrusion 221p and a plurality of recesses including the first recess 221r in the circumferential direction. Further, the second electrode 222 may be formed to alternately provide a plurality of protrusions including the second protrusion 222p and a plurality of recesses including the second recess 222r in the circumferential direction.

Figure 6:
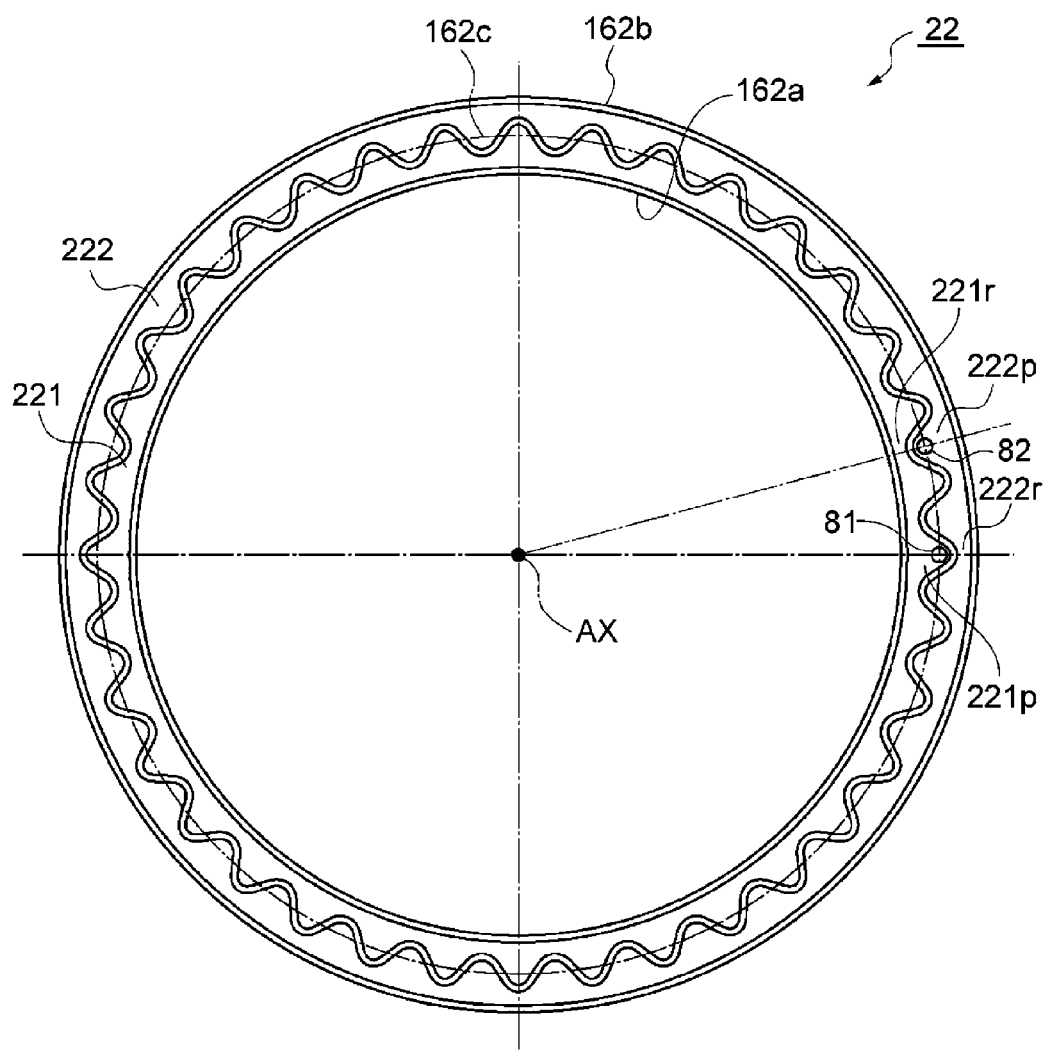
FIG. 6 is a schematic view illustrating layouts of a first electrode and a second electrode in a chuck area of a substrate support according to another exemplary embodiment.
Figure 7:
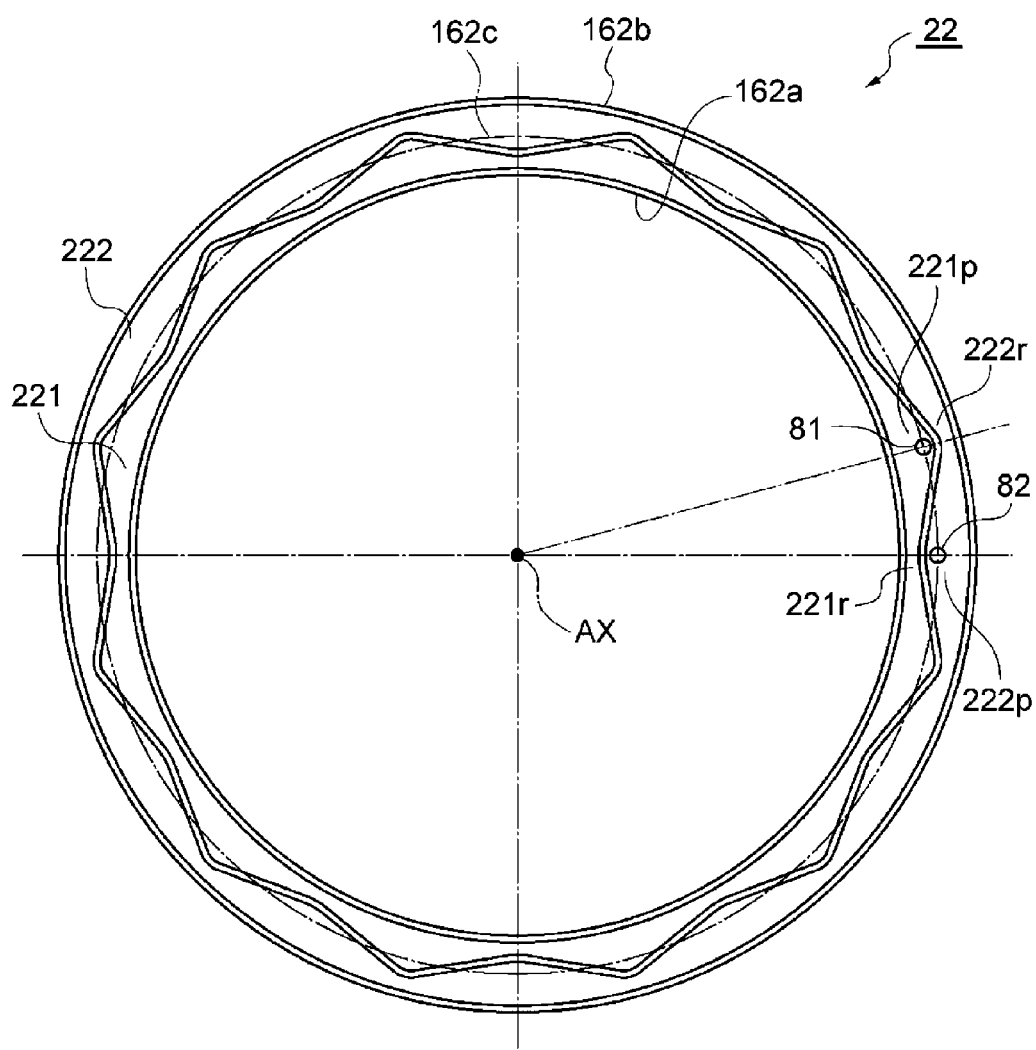
FIG. 7 is a schematic view illustrating layouts of a first electrode and a second electrode in a chuck area of a substrate support according to yet another exemplary embodiment.

In the following, reference will be made to FIGS. 6 and 7. FIGS. 6 and 7 are schematic views illustrating layouts of a first electrode and a second electrode in a chuck area of a substrate support according to yet another exemplary embodiment. As illustrated in FIGS. 6 and 7, the outer edge of the first electrode 221 and the inner edge of the second electrode 222 may be formed in a wave shape. In each of the embodiments illustrated in FIGS. 6 and 7, the outer edge of the first electrode 221 extends alternately inward and outward with respect to the center 162c along the circumferential direction. The inner edge of the second electrode 222 extends alternately inward and outward with respect to the center 162c along the circumferential direction, and further, extends along the outer edge of the first electrode 221. As illustrated in FIGS. 6 and 7, the outer edge of the first electrode 221 and the inner edge of the second electrode 222 may be a curved shape, or a polygonal shape.

The chuck area 22 illustrated in FIGS. 1 to 7 is separated from the chuck area 20. However, the substrate support 16 may have one electrostatic chuck in which the chuck area 20 and the chuck area 22 are integrated. That is, the chuck area 20 and the chuck area 22 may be integrated.

Reference will be made again to FIGS. 1 and 3. In the embodiment, the plasma processing apparatus 1 is configured to be capable of applying a voltage to the focus ring FR. When a negative voltage is applied to the focus ring FR, an upper end position of a sheath on the focus ring FR is adjusted. The substrate support 16 further has a conductive structure 24 and a holder 25. The conductive structure 24 is configured to be electrically connected to the focus ring FR. The conductive structure 24 includes a conductive path 26 and a connection member 27.

The conductive path 26 supplies a terminal area 26t outward in the radial direction with respect to the second support area 162. The conductive path 26 extends downward from the terminal area 26t. The conductive path 26 is formed by one or more conductors. In the embodiment, the plasma processing apparatus 1 may further include an insulating area. The insulating area extends outward in the radial direction of the second support area 162 and below the lower electrode 18. The conductive path 26 extends in the insulating area.

In the embodiment, the insulating area is constituted by a plurality of insulating members 91 to 96. The number of the insulating members that constitute the insulating area may be any number. The plurality of insulating members 91 to 96 are made of quartz or aluminum oxide. An insulating member 91 has a substantially cylindrical shape. The insulating member 91 extends upward from the bottom of the chamber 10. Each of insulating members 92 and 93 has a substantially disc shape. The diameter of the insulating member 93 is smaller than the diameter of the insulating member 92. The insulating member 93 is provided on the insulating member 92. The lower electrode 18 is provided on the insulating member 93.

An insulating member 94 has a substantially annular shape. The insulating member 94 is disposed on the circumferential edge of the insulating member 92. The insulating member 94 is disposed outside the insulating member 93 in the radial direction. The insulating member 94 extends in the circumferential direction along the outer peripheral surface of the insulating member 93. An insulating member 95 has a substantially cylindrical shape. The insulating member 95 has an outer diameter smaller than the outer diameter of the insulating member 94. The insulating member 95 is disposed on the insulating member 94. The insulating member 95 extends along the outer peripheral surface of the lower electrode 18 and the outer edge of the chuck area 22.

The cylindrical portion 97 extends upward from the bottom of the chamber 10. The cylindrical portion 97 has a substantially cylindrical shape. The cylindrical portion 97 extends along the outer peripheral surface of the insulating member 91. The cylindrical portion 97 is made of a metal such as aluminum. The cylindrical portion 97 is grounded in the same manner as the chamber 10. An insulating member 96 has a substantially cylindrical shape. The insulating member 96 is disposed on the cylindrical portion 97. The insulating member 96 extends along the outer peripheral surface of the insulating member 92, the outer peripheral surface of the insulating member 94, the outer peripheral surface of the holder 25, and the outer peripheral surface of the focus ring FR.

In the embodiment, the conductive path 26 provides the terminal area 26t on the insulating member 94. The conductive path 26 extends downward through the insulating member 94 and the insulating member 92. A power supply 99 is electrically connected to the conductive path 26 through a low pass filter 98. The low pass filter 98 is configured to attenuate or block the radio-frequency flowing into the power supply 99. The power supply 99 is configured to generate a DC voltage or a radio-frequency voltage applied to the focus ring FR. The voltage applied from the power supply 99 to the focus ring FR may be a negative voltage.

The connection member 27 is disposed on the terminal area 26t of the conductive path 26. The connection member 27 electrically connects the focus ring FR and the terminal area 26t. The connection member 27 faces a surface FRS of the focus ring FR in a state of being disposed on the terminal area 26t. The surface FRS extends outward in the radial direction with respect to the connection member 27, and is directed inward in the radial direction.

In the embodiment, the focus ring FR may have a first annular portion FR1 and a second annular portion FR2. The first annular portion FR1 has an annular shape and also forms a plate shape, and is disposed on the second support area 162 (i.e., on the chuck area 22). In the plasma processing apparatus 1, the substrate W is disposed in an area which is surrounded by the first annular portion FR1. The second annular portion FR2 provides the surface FRS. The second annular portion FR2 extends downward from the outer periphery of the first annular portion FR1 to face the connection member 27.

The holder 25 holds the connection member 27 so as to press the connection member 27 downward, and also to cause the connection member 27 to press the surface FRS of the focus ring FR. In the substrate support 16, since the connection member 27 is pressed by the holder 25, a reliable electrical connection between the connection member 27 and the terminal area 26t is implemented. Further, the connection member 27 presses the surface FRS of the focus ring FR disposed outside the connection member 27 in the radial direction in a state of being held by the holder 25. Therefore, a reliable electrical connection between the connection member 27 and the focus ring FR is implemented. Further, the direction in which the connection member 27 presses the surface FRS of the focus ring FR is a direction substantially orthogonal to the direction in which the electrostatic attractive force generated between the chuck area 22 and the focus ring FR is exerted. Therefore, an electrical path is provided which is capable of being connected with the focus ring FR while suppressing generating of the force that opposes the electrostatic attractive force holding the focus ring FR. According to the substrate support 16, the focus ring FR is stable held in the second support area 162. Further, when the heat transfer gas is supplied between the focus ring FR and the chuck area 22, the focus ring FR is stably held in the second support area 162. Therefore, it is possible to increase the pressure of the heat transfer gas supplied between the focus ring FR and the chuck area 22. Therefore, it is possible to increase the efficiency of the temperature adjustment of the focus ring FR.

In the embodiment, the connection member 27 may have a first portion 271 and a second portion 272. The first portion 271 faces the surface FRS of the focus ring FR. The second portion 272 is continued at the lower portion of the first portion 271. The second portion 272 extends outward in the radial direction form the lower portion of the first portion 271. In the embodiment, the cross-sectional shape of the connection member 27 is "L."

The holder 25 holds the connection member 27 to press the second portion 272 downward. In the embodiment, the holder 25 is disposed on the insulating member 94. The holder 25 is fixed to the insulating member 94 by a screw 28. In the embodiment, the holder has a main portion 251 and a protrusion 252. The main portion 251 has a substantially cylindrical shape. The main portion 251 is disposed on the insulating member 94. The protrusion 252 protrudes inward in the radial direction from the upper end of the main portion 251. The protrusion 252 is disposed on the second portion 272 of the connection member 27. When the holder 25 is fixed, the second portion 272 of the connection member 27 is pressed downward, and the first portion 271 exerts a force outward in the radial direction. As a result, it is possible to reliably contact the connection member 27 and the focus ring FR with each other.

In the embodiment, the substrate support 16 may further have a conductive member 58. The conductive member 58 has conductivity and elasticity. The conductive member 58 may be, for example, a spiral spring gasket made of a conductor. The conductive member 58 is sandwiched between the connection member 27 and the terminal area 26t.

In the embodiment, the substrate support 16 may further have a conductive member 59. The conductive member 59 has conductivity and elasticity. The conductive member 59 may be, for example, a spiral spring gasket made of a conductor. The conductive member 59 is sandwiched between the connection member 27 and the surface FRS of the focus ring FR. In another embodiment, the first portion 271 of the connection member 27 may have elasticity, and press the surface FRS of the focus ring FR.

In the embodiment, the holder 25 may have an insulating property. The holder 25 is made of, for example, quartz or aluminum oxide. The holder 25 and the focus ring FR (i.e., the second annular portion FR2 thereof) shield the connection member 27 from plasma. In the embodiment, the connection member 27 is protected from plasma.

Although various exemplary embodiments have been described above, the present disclosure is not limited to the exemplary embodiments described above, and various omissions, substitutions, and modifications may be made. Further, it is possible to combine the elements in different embodiments to form other embodiments.

For example, although the plasma processing apparatus 1 is a capacitively coupled plasma processing apparatus, a plasma processing apparatus according to other embodiments may be a different type of plasma processing apparatus. Such plasma processing apparatus may be any type of plasma processing apparatus. Examples of such plasma processing apparatus includes an inductively coupled plasma processing apparatus, and a plasma processing apparatus that generates plasma by surface waves such as microwaves.

Further, in other embodiments, the chuck area 22 may have three or more electrodes as electrodes used for generating an electrostatic attractive force.

Further, in the example illustrated in FIG. 3, both of the voltage applied to the first electrode 221 and the voltage applied to the second electrode 222 are positive voltages. However, as long as a potential difference is generated between the first electrode 221 and the second electrode 222, the polarity of each of the voltage applied to the first electrode 221 and the voltage applied to the second electrode 222 is not limited. Further, the potential of one of the first electrode 221 and the second electrode 222 may be 0 V. Further, in order to generate a potential difference between the first electrode 221 and the second electrode 222, a single power supply may be used.

Further, the number of the connection member 27 is not limited. A plurality of connection member 27 may be used for electrical connection between the terminal area 26t and the focus ring FR. The plurality of connection member 27 may be arranged along the circumferential direction. The plurality of connection member 27 may be equidistantly disposed along the circumferential direction.

According to one exemplary embodiment, it is possible to provide an electrical path which is connected with the focus ring while suppressing generating of the force that opposes the electrostatic attractive force holding the focus ring.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate support for a plasma processing apparatus, the substrate support comprising:
    a substrate chuck region;
    a focus ring chuck region surrounding the substrate chuck region;
    a focus ring having a first face and a second face, the first face being in contact with the focus ring chuck region, the second face extending downward from the first face and facing a sidewall of the focus ring chuck region;
    a connector having a first portion and a second portion, the first portion being disposed between the second face of the focus ring and the sidewall of the focus ring chuck region, the first portion being electrically connected to the second face of the focus ring, the second portion extending radially outward from a bottom of the first portion;
    an insulator disposed between the connector and the sidewall of the focus ring chuck region;
    a conductive path electrically connected to a lower end of the connector and extending downward from the lower end of the connector; and
    a holder configured to press the second portion of the connector downward to hold the connector on the conductive path and press the first portion of the connector against the second face of the focus ring.

2. The substrate support according to claim 1, further comprising a first elastic conductor disposed between the connector and the conductive path.

3. The substrate support according to claim 2, further comprising a second elastic conductor disposed between the connector and the second face of the focus ring.

4. The substrate support according to claim 3, wherein the focus ring includes:
    a first annular portion disposed on the focus ring chuck region; and
    a second annular portion extending downward from an outer end of the first annular portion, and
    wherein the second annular portion has the second face.

5. The substrate support according to claim 4, wherein the holder has insulation, and the connector is shielded by the focus ring and the holder.

6. The substrate support according to claim 5, wherein the focus ring chuck region includes a chuck region configured to hold the focus ring by electrostatic attractive force.

7. The substrate support according to claim 6, further comprising a gas line extending through the focus ring chuck region, the gas line being configured to supply a heat transfer gas into a space between the focus ring chuck region and the focus ring.

8. The substrate support according to claim 1, further comprising a second elastic conductor disposed between the connector and the second face of the focus ring.

9. The substrate support according to claim 1, wherein the focus ring includes:
    a first annular portion disposed on the focus ring chuck region; and
    a second annular portion extending downward from an outer end of the first annular portion, and
    wherein the second annular portion has the second face.

10. The substrate support according to claim 1, wherein the focus ring chuck region includes a chuck region configured to hold the focus ring by electrostatic attractive force.

11. The substrate support according to claim 1, further comprising a gas line extending through the focus ring chuck region, the gas line being configured to supply a heat transfer gas into a space between the focus ring chuck region and the focus ring.

12. The substrate support according to claim 1, wherein the connector has an L cross-sectional shape.

13. The substrate support according to claim 1, wherein the holder is disposed radially outwardly of the second face of the focus ring.

14. The substrate support according to claim 1, wherein the holder includes:
    a third portion on the second portion of the connector and extending outward from a side of the first portion of the connector; and
    a fourth portion extending downward from a bottom of the third portion.

15. The substrate support according to claim 1, wherein the holder has insulation, and the connector is shielded by the focus ring and the holder.

16. A plasma processing apparatus comprising:
    a chamber;
    a substrate support disposed in the chamber, the substrate support including,
        a substrate chuck region,
        a focus ring chuck region surrounding the substrate chuck region,
        a focus ring having a first face and a second face, the first face being in contact with the focus ring chuck region, the second face extending downward from the first face and facing a sidewall of the focus ring chuck region,
        a connector having a first portion and a second portion, the first portion being disposed between the second face of the focus ring and the sidewall of the focus ring chuck region, the first portion being electrically connected to the second face of the focus ring, the second portion extending radially outward from a bottom of the first portion,
        an insulator disposed between the connector and the sidewall of the focus ring chuck region,
        a conductive path electrically connected to a lower end of the connector and extending downward from the lower end of the connector, and
        a holder configured to press the second portion of the connector downward to hold the connector on the conductive path and press the first portion of the
connector against the second face of the focus ring,
and a plasma generator configured to generate a plasma in the
chamber.

\* \* \* \* \*